United States Patent
Lee et al.

(10) Patent No.: US 12,471,476 B2
(45) Date of Patent: Nov. 11, 2025

(54) DISPLAY DEVICE DISPLAY DEVICE WITH SUBPIXELS INCLUDING A WHITE QUANTUM DOT

(71) Applicant: LG Display Co., Ltd., Seoul (KR)

(72) Inventors: Jaeho Lee, Seoul (KR); Wonhoe Koo, Goyang-si (KR); Kyung Hoon Han, Paju-si (KR); YongCheol Kim, Goyang-si (KR); Hyekyung Choi, Seoul (KR)

(73) Assignee: LG Display Co., Ltd. (KR)

( * ) Notice: Subject to any disclaimer, the term of this patent is extended or adjusted under 35 U.S.C. 154(b) by 412 days.

(21) Appl. No.: 17/359,429

(22) Filed: Jun. 25, 2021

(65) Prior Publication Data

US 2021/0408137 A1 Dec. 30, 2021

(30) Foreign Application Priority Data

Jun. 26, 2020 (KR) .................. 10-2020-0078184

(51) Int. Cl.
*H10K 59/38* (2023.01)
*H10K 59/35* (2023.01)

(52) U.S. Cl.
CPC .......... *H10K 59/38* (2023.02); *H10K 59/353* (2023.02)

(58) Field of Classification Search
CPC ...... H10K 59/38; H10K 59/351; H10K 50/11; H10K 50/13–131; H10K 50/00–88; G09G 3/32
See application file for complete search history.

(56) References Cited

U.S. PATENT DOCUMENTS

2007/0145350 A1* 6/2007 Kobori .................. H10K 50/85 257/13
2007/0164664 A1* 7/2007 Ludwicki ............. G09G 3/2003 313/504

(Continued)

FOREIGN PATENT DOCUMENTS

KR 20160000811 A * 1/2016
KR 10-2017-0050989 A 5/2017

(Continued)

OTHER PUBLICATIONS

Janardan, Kundu et al., "Giant Nanocrystal Quantum Dots: Stable Down-Conversion Phosphors that Exploit a Large Stokes Shift and Efficient Shell-to-Core Energy Relaxation" .Nano Lett. 2012, 12, 6, 3031-3037, Publication Date:May 8, 2012 (Year: 2012).*

Ya-Ju Lee, Chia-Jung Lee, and Chun-Mao Cheng, "Enhancing the conversion efficiency of red emission by spin-coating CdSe quantum dots on the green nanorod light-emitting diode," Opt. Express 18, A554-A561 (2010) (Year: 2010).*

(Continued)

*Primary Examiner* — Sue A Purvis
*Assistant Examiner* — Seyon Ali-Simah Punchbeddell
(74) *Attorney, Agent, or Firm* — Fish & Richardson P.C.

(57) ABSTRACT

A display device includes, a light emitting element which is disposed in each of a plurality of subpixels and includes a first blue light emitting layer, a green light emitting layer on the first blue light emitting layer, and a second blue light emitting layer on the green light emitting layer; a first light conversion layer disposed in a first subpixel among the plurality of subpixels; and a second light conversion layer disposed in a second subpixel among the plurality of subpixels and having higher light conversion efficiency than the first light conversion layer, thus, the second light conversion layer having high light conversion efficiency is disposed in the second subpixel which is a red subpixel, thereby improving the luminance of the red light.

14 Claims, 10 Drawing Sheets

(56) References Cited

U.S. PATENT DOCUMENTS

| | | | | |
|---|---|---|---|---|
| 2012/0147601 | A1* | 6/2012 | Li | F21V 9/08 |
| | | | | 362/231 |
| 2013/0320308 | A1* | 12/2013 | Lee | H10K 50/80 |
| | | | | 438/34 |
| 2016/0062183 | A1* | 3/2016 | Sung | G02F 1/133514 |
| | | | | 349/71 |
| 2017/0076678 | A1* | 3/2017 | Lee | G02F 1/1336 |
| 2018/0006196 | A1* | 1/2018 | Linkov | H01L 33/60 |
| 2018/0108303 | A1* | 4/2018 | Park | G09G 3/3413 |
| 2018/0351039 | A1* | 12/2018 | Kim | H01L 33/325 |
| 2018/0374409 | A1* | 12/2018 | Lee | H10K 59/12 |
| 2019/0049779 | A1* | 2/2019 | Lee | H10K 59/352 |
| 2019/0096960 | A1* | 3/2019 | Lee | H10K 50/115 |
| 2020/0027928 | A1* | 1/2020 | Wu | H10K 59/35 |
| 2020/0144460 | A1* | 5/2020 | Onuma | G09G 3/32 |
| 2021/0328114 | A1* | 10/2021 | Tangring | C09K 11/02 |
| 2021/0376272 | A1* | 12/2021 | You | H10K 59/38 |

FOREIGN PATENT DOCUMENTS

| | | |
|---|---|---|
| KR | 10-2019-0000759 A | 1/2019 |
| KR | 10-2019-0016631 A | 2/2019 |
| KR | 20200063964 A | 6/2020 |

OTHER PUBLICATIONS

Hu, Zhiping , Yin Y , Ali MU , Peng W , Zhang S , Li D , Zou T , Li Y , Jiao S, Chen SJ , Lee CY , Meng H , Zhou H . Inkjet printed uniform quantum dots as color conversion layers for full-color OLED displays. Nanoscale. Dec. 18, 2019 https://pubs.rsc.org/en/content/articlelanding/2020/nr/c9nr09086j (Year: 2019).*

Korean Office Action dated Sep. 9, 2024 issued in Patent Application No. 10-2020-0078184 w/English Translation (23 pages).

Chinese Office Action dated Nov. 18, 2024 in Patent Application No. 202110684387.7.

* cited by examiner

DISPLAY DEVICE DISPLAY DEVICE WITH SUBPIXELS INCLUDING A WHITE QUANTUM DOT

CROSS-REFERENCE TO RELATED APPLICATION

This application claims the priority of Korean Patent Application No. 10-2020-0078184 filed on Jun. 26, 2020, which is hereby incorporated by reference in its entirety.

BACKGROUND

Field of the Disclosure

The present disclosure relates to a display device, and more particularly, to a display device with improved luminance.

Description of the Background

In display devices which are used for monitors of computers, TVs, mobile phones, or the like, there are an organic light emitting diode (OLED) display device that self-emits light, a liquid crystal display (LCD) device that requires a separate light source, etc.

The display devices are increasingly diversified in application ranges up to personal mobile devices as well as monitors of computers and TVs, and research on display devices with reduced volume and weight as well as a wide display area have been conducted.

SUMMARY

Accordingly, the present disclosure provides a display device with improved luminance.

Also, the present disclosure provides a display device with improved efficiency of red light and green light emitted from a light emitting element.

Further, the present disclosure provides a display device capable of easily adjusting a color temperature of white light.

The present disclosure is not limited to the above-mentioned, which is not mentioned above, can be clearly understood by those skilled in the art from the following descriptions.

According to an aspect of the present disclosure, the display device includes: a light emitting element which is disposed in each of a plurality of subpixels and includes a first blue light emitting layer, a green light emitting layer on the first blue light emitting layer, and a second blue light emitting layer on the green light emitting layer; a first light conversion layer disposed in a first subpixel among the plurality of subpixels; and a second light conversion layer disposed in a second subpixel among the plurality of subpixels and having higher light conversion efficiency than the first light conversion layer. Therefore, the second light conversion layer having high light conversion efficiency is disposed in the second subpixel which is a red subpixel, thereby improving the luminance of the red light.

According to another aspect of the present disclosure, the display device includes: a light emitting unit disposed in a plurality of subpixels including a plurality of white subpixels and a plurality of red subpixels and including a light emitting layer emitting blue light and a light emitting layer emitting green light; a first light conversion layer disposed in the plurality of white subpixels to convert the light emitted from the light emitting unit into red light; and a second light conversion layer disposed in the plurality of red subpixels to convert the light emitted from the light emitting unit into red light, in which the light conversion efficiency of the second light conversion layer is higher than the light conversion efficiency of the first light conversion layer. Therefore, in the red subpixel, the green light and the blue light from the light emitting unit are maximally converted into the red light, thereby improving the luminance of the display device.

Other detailed matters of the exemplary aspects are included in the detailed description and the drawings.

According to the present disclosure, it is possible to improve the luminance of the display device by enhancing the efficiency of red light and green light in the light emitting element.

According to the present disclosure, it is possible to display white light having a high color temperature by adjusting a ratio of green light and blue light emitted from the light emitting element.

According to the present disclosure, it is possible to easily implement red light and green light with high luminance.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
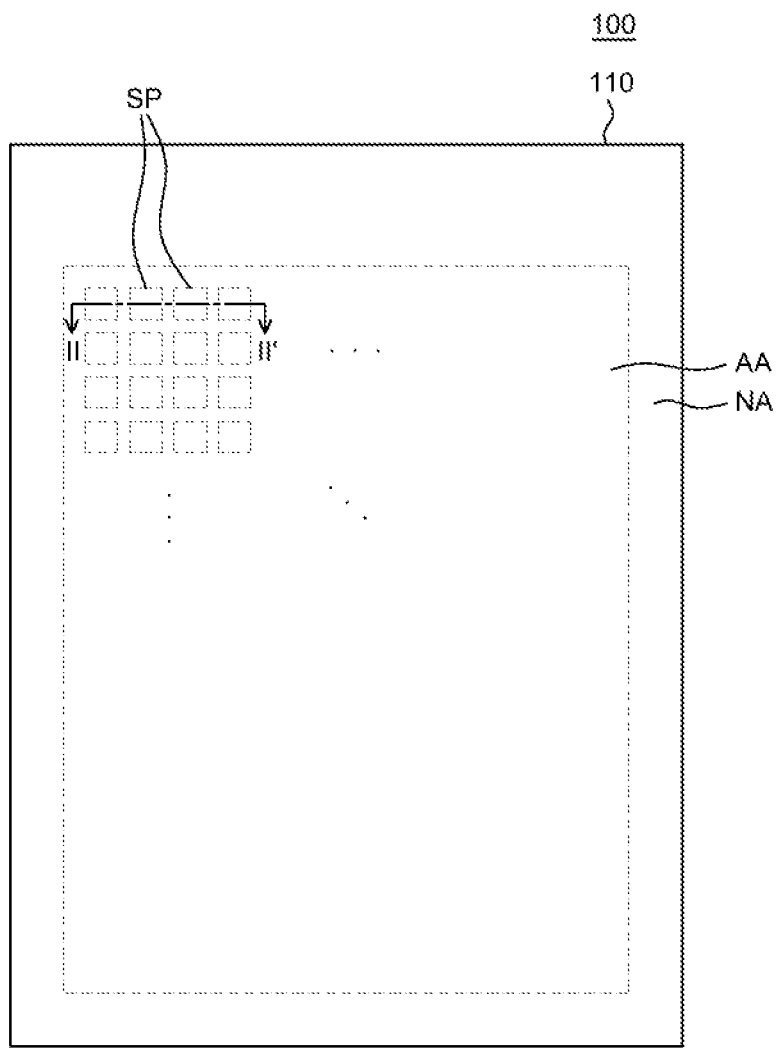
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. same reference numerals generally denote same elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly disposed on the another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a plan view of a display device according to an exemplary aspect of the present disclosure. In FIG. 1, for convenience of description, only a substrate 110 and a plurality of subpixels SPs of various components of a display device 100 are illustrated.

The substrate 110 may be a support member for supporting other components of the display device 100, and may be made of an insulating material. For example, the substrate 110 may be made of glass, resin, or the like. Further, the substrate 110 may be made of plastic such as polymer or polyimide (PI), or also made of a material having flexibility.

The substrate 110 includes a display area AA and a non-display area NA. The display area AA is an area for displaying an image. In the display area AA, a plurality of subpixels SPs for displaying an image and a driving circuit for driving the plurality of subpixels SPs may be disposed. The driving circuit may include various thin film transistors, storage capacitors, lines, and the like for driving the subpixels SPs. For example, the driving circuit may consist of various components such as a driving transistor, a switching transistor, a storage capacitor, a scan line, and a data line, but is not limited thereto.

The non-display area NA is an area where the image is not displayed, and an area where various lines, driving ICs, and the like are disposed to drive the subpixels SPs disposed in the display area AA. For example, various driving ICs such as a gate driver IC and a data driver IC may be disposed in the non-display area NA.

Meanwhile, in FIG. 1, the non-display area NA is illustrated as surrounding the display area AA, but the non-display area NA may be an area extending from any one side of the display area AA but is not limited thereto.

A plurality of subpixels SPs is disposed in the display area AA. Each of the plurality of subpixels SPs is an individual unit for emitting light, and a light emitting element and a driving circuit are formed in each of the plurality of subpixels SPs. For example, the plurality of subpixels SPs may include red subpixels, green subpixels, blue subpixels, and white subpixels, but is not limited thereto.

Hereinafter, the plurality of subpixels SPs will be described in more detail with reference to FIG. 2.

Figure 2:
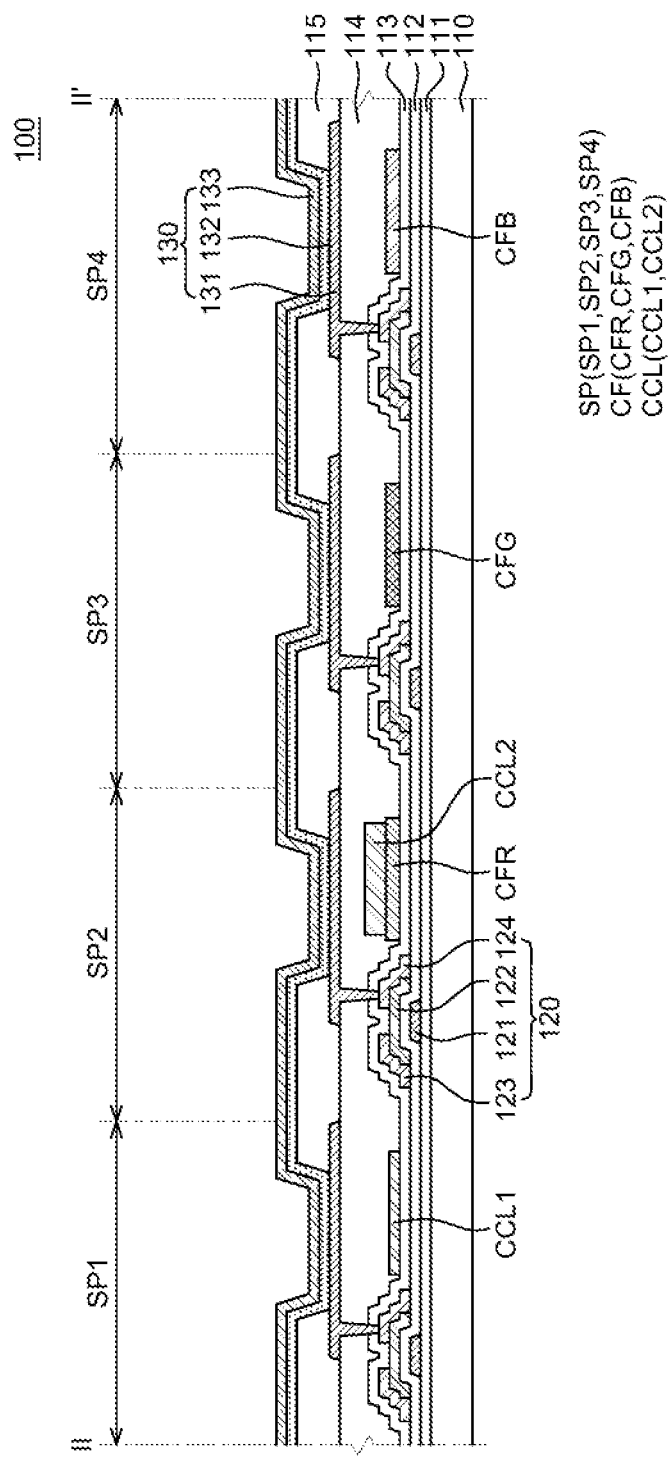
FIG. 2 is a cross-sectional view taken along line II-II' of FIG. 1.

FIG. 2 is a cross-sectional view taken along line II-II' of FIG. 1. Referring to FIG. 2, the display device 100 according to an exemplary aspect of the present disclosure includes a substrate 110, a buffer layer 111, a gate insulating layer 112, a protective layer 113, a planarization layer 114, a bank 115, a transistor 120, a light emitting element 130, a light conversion layer CCL, and a color filter CF.

First, the plurality of subpixels SPs includes a first subpixel SP1, a second subpixel SP2, a third subpixel SP3, and a fourth subpixel SP4. The first subpixel SP1, the second subpixel SP2, the third subpixel SP3 and the fourth subpixel SP4 may emit light having different colors, respectively. For example, the first subpixel SP1, the second subpixel SP2, the third subpixel SP3 and the fourth subpixel SP4 may be one of white subpixels emitting white light, red subpixels emitting red light, green subpixels emitting green light, and blue subpixels emitting blue light, respectively. Hereinafter, it will be described that it is assumed that the first subpixel SP1 is a white subpixel, the second subpixel SP2 is a red subpixel, the third subpixel SP3 is a green subpixel, and the fourth subpixel SP4 is a blue subpixel, but it is not limited thereto.

The buffer layer 111 is disposed on the substrate 110. The buffer layer 111 may minimize moisture and/or oxygen penetrating from the outside of the substrate 110 to be diffused into the display device 100. The buffer layer 111 may be made of an inorganic material, and for example, the buffer layer 111 may be composed of a single layer or multilayer of silicon oxide (SiOx) or a silicon nitride (SiNx) but is not limited thereto.

A plurality of transistors 120 is disposed on the buffer layer 111. Each of the plurality of transistors 120 may be disposed in each of the plurality of subpixels SPs. The transistor 120 disposed in each of the plurality of subpixels SPs may be used as a driving element of the display device 100. The transistor 120 may be, for example, a thin film transistor (TFT), an N-channel metal oxide semiconductor (NMOS) transistor, a P-channel metal oxide semiconductor (PMOS) transistor, a complementary metal oxide semiconductor (CMOS) transistor, a field effect transistor (FET), etc., but is not limited thereto. Hereinafter, it will be described that the plurality of transistors 120 is assumed as thin film transistors, but it is not limited thereto.

The transistor 120 includes a gate electrode 121, an active layer 122, a source electrode 123, and a drain electrode 124.

The gate electrode 121 of the transistor 120 is disposed on the buffer layer 111. The gate electrode 121 may be composed of a conductive material, for example, copper (Cu), aluminum (Al), molybdenum (Mo), titanium (Ti), or alloys thereof, but is not limited thereto.

The gate insulating layer 112 is disposed on the gate electrode 121. The gate insulating layer 112 is a layer for insulating the gate electrode 121 and the active layer 122. The gate insulating layer 112 may be made of an inorganic material, and for example, the gate insulating layer 112 may be composed of a single layer or multilayer of silicon oxide (SiOx) or a silicon nitride (SiNx), but is not limited thereto.

The active layer 122 is disposed on the gate insulating layer 112. The active layer 122 may be made of an oxide semiconductor, amorphous silicon or polysilicon, and the like, but is not limited thereto.

On the active layer 122, the source electrode 123 and the drain electrode 124 are disposed to be spaced apart from each other. The source electrode 123 and the drain electrode 124 are in contact with the active layer 122 to be electrically connected to the active layer 122. The source electrode 123 and the drain electrode 124 may be composed of a conductive material, for example, titanium (Ti), copper (Cu), aluminum (Al), molybdenum (Mo), or alloys thereof, but is not limited thereto.

Meanwhile, in FIG. 2, the transistor 120 has been illustrated as a bottom gate structure in which the active layer 122 is disposed on the gate electrode 121, but may be implemented as a different structure such as a top gate structure, and it is not limited thereto.

The protective layer 113 is disposed on the transistor 120. The protective layer 113 is an insulating layer for protecting the transistor 120. The protective layer 113 may be composed of a single layer of silicon nitride (SiNx) or silicon oxide (SiOx) as an inorganic material, or a multilayer of silicon nitride (SiNx) and silicon oxide (SiOx), but is not limited thereto. However, the protective layer 113 may also be omitted depending on a design of the display device 100.

Meanwhile, the display device 100 may be implemented as a top emission type display device or a bottom emission type display device. The top emission type is a type in which the light emitted from the light emitting element 130 is emitted to the top of the light emitting element 130 to implement an image on the top of the substrate 110. The bottom emission type is a type in which the light emitted from the light emitting element 130 is emitted to the bottom of the light emitting element 130 to implement an image on the bottom of the substrate 110. In addition, the display device 100 may be implemented in a double-sided emission type in which the light emitted from the light emitting element 130 is emitted to the top and the bottom of the light emitting element 130 to implement an image on both surfaces of the substrate 110. Hereinafter, the display device 100 is described as the bottom emission type but is not limited thereto.

A plurality of color filters CFs is disposed on the protective layer 113. The plurality of color filters CFs may convert the light emitted from the light emitting element 130 to various colors. Specifically, the plurality of color filters CFs transmits only light having a specific wavelength range in the light emitted from the light emitting element 130, and absorbs the remaining light to convert the colors of the light emitted to the outside of the display device 100.

The plurality of color filters CFs includes a red color filter CFR, a green color filter CFG, and a blue color filter CFB. The red color filter CFR may be disposed in the second subpixel SP2 as the red subpixel, the green color filter CFG may be disposed in the third subpixel SP3 as the green subpixel, and the blue color filter CFB may be disposed in the fourth subpixel SP4 as the blue subpixel.

Light conversion layers CCL are disposed on some subpixels SPs of the plurality of subpixels SPs. The light conversion layers CCL may be disposed in the first subpixel SP1 and the second subpixel SP2 as the white subpixel and the red subpixel of the plurality of subpixels SPs. The light conversion layer CCL may convert the light emitted from the light emitting element 130 to various colors. Specifically, the light conversion layer CCL may convert the color of the light by absorbing the light emitted from the light emitting element 130 to emit light having a specific wavelength.

The light conversion layer CCL includes a first light conversion layer CCL1 and a second light conversion layer CCL2. The first light conversion layer CCL1 is disposed on the protective layer 113 in the first subpixel SP1, and the second light conversion layer CCL2 is disposed on the red color filter CFR in the second subpixel SP2, that is, the red color filter CFR may be disposed to overlap with the second light conversion layer CCL2. The first light conversion layer CCL1 and the second light conversion layer CCL2 may convert the light emitted from the light emitting element 130 into light having the same color. For example, the first light conversion layer CCL1 and the second light conversion layer CCL2 may be light conversion layers CCLs that convert the light emitted from the light emitting element 130 into red light, and a more detailed content will be described below with reference to FIG. 3.

Each of the first light conversion layer CCL1 and the second light conversion layer CCL2 includes a base member and a light conversion material.

The base member is a transparent member for supporting the light conversion material, and may be made of a transparent photoresist, an acryl material such as poly(methyl methacrylate) (PMMA), and a transparent material of a silicon resin such as poly-di-methyl-siloxane (PDMS), or an epoxy resin, but is not limited thereto.

The light conversion material is a material that is distributed in the base member and absorbs the light emitted from the light emitting element 130 to convert the light into light of different colors. The light conversion material may be made of, for example, a nanophosphor, an organic phosphor, a quantum dot, a fluorescent dye, and the like, but is not limited thereto.

For example, when the light conversion material is made of the fluorescent dye, the light conversion material may be made of a material such as Ph9(9-diethylamino-5H-benzo[a]phenoxazin-5-one), or Ph95(9-Diphenylamino-5H-benzo[a]phenoxazin-5-one), which converts green light and blue light into red light, but is not limited thereto.

For example, when the light conversion material is made of the quantum dot, the light conversion material may be made of a quantum dot material such as InAs, InP, or PbS, which converts green light and blue light into red light, but is not limited thereto.

The thickness of the first light conversion layer CCL1 may be smaller than the thickness of the second light conversion layer CCL2. When the first light conversion layer CCL1 has a smaller thickness than the second light conversion layer CCL2, the light conversion efficiency in the first light conversion layer CCL1 may be lower than the light conversion efficiency in the second light conversion layer CCL2. Specifically, when the first light conversion layer CCL1 and the second light conversion layer CCL2 are formed by using the base member in which the light conversion material is distributed at the same concentration, as the thickness of the light conversion layer CCL is increased, the amount of the light conversion material included in the light conversion layer CCL may be increased. Therefore, since the thickness of the second light conversion layer CCL2 is larger than that of the first light conversion layer CCL1, the light conversion efficiency in the second light conversion layer CCL2 may be higher than the light conversion efficiency in the first light conversion layer CCL1.

Additionally, in order to control the light conversion efficiency of the first light conversion layer CCL1 and the second light conversion layer CCL2, the type or the concentration of the light conversion material included in each of the first light conversion layer CCL1 and the second light conversion layer CCL2 may be differently configured. For example, in order to lower the efficiency of the first light conversion layer CCL1, a light conversion material having relatively low light conversion efficiency may also be used, and the concentration of the light conversion material of the first light conversion layer CCL1 may also be decreased.

On a cross section, the width of the second light conversion layer CCL2 may be smaller than or equal to that of the red color filter CFR. On a plane, the size (or area) of the second light conversion layer CCL2 may be smaller than or equal to that of the red color filter CFR. That is, the size of a lower surface of the second light conversion layer CCL2 in contact with the red color filter CFR may be smaller than or equal to that of an upper surface of the red color filter CFR. In addition, the entire lower surface of the second light conversion layer CCL2 may be in contact with only the upper surface of the red color filter CFR.

If the second light conversion layer CCL2 protrudes outside the red color filter CFR, a mixed color occurs by the second light conversion layer CCL2 protruding from the first subpixel SP1 and/or the third subpixel SP3 adjacent to the second subpixel SP2, so that the display quality may be deteriorated. For example, when the second light conversion layer CCL2 protrudes outside the red color filter CFR and extends to the first subpixel SP1, the purity of the white light displayed in the first subpixel SP1 may be deteriorated. Likewise, when the second light conversion layer CCL2 extends to the third subpixel SP3, the purity of the green light displayed in the third subpixel SP3 may be deteriorated. Therefore, the entire lower surface of the second light conversion layer CCL2 is disposed to be in contact with only the upper surface of the red color filter CFR, thereby minimizing the mixed color problem between the plurality of subpixels SPs.

The planarization layer 114 is disposed on the first light conversion layer CCL1 and the second light conversion layer CCL2. The planarization layer 114 may planarize the top of the substrate 110. The planarization layer 114 may be composed of a single layer or a multilayer and may be made of an organic material. For example, the planarization layer 114 may be made of an acrylic organic material but is not limited thereto.

The light emitting element 130 is disposed on the planarization layer 114. The light emitting element 130 is an element for emitting light and may be disposed in each of the plurality of subpixels SPs to be driven by the plurality of transistors 120. The light emitting element 130 may include an anode 131, a light emitting unit 132, and a cathode 133.

The anode 131 may supply holes to the light emitting unit 132 and may be made of a conductive material having a high work function. For example, the anode 131 may be made of tin oxide (TO), indium tin oxide (ITO), indium zinc oxide (IZO), indium zinc tin oxide (ITZO), etc., but is not limited thereto.

The bank 115 is disposed on the anode 131. The bank 115 may be disposed to cover an edge of the anode 131. The bank 115 may be disposed at a boundary between the plurality of subpixels SPs to define the plurality of subpixels SPs. The bank 115 may be made of an insulating material, for example, a polyimide, acryl, or benzocyclobutene (BCB)-based resin, but is not limited thereto.

The light emitting unit 132 is disposed on the anode 131 and the bank 115. The light emitting unit 132 may receive holes from the anode 131 and receive electrons from the cathode 133 to emit light. The light emitting unit 132 may be formed by laminating a plurality of stacks including one or more light emitting layers. For example, the light emitting unit 132 may include a plurality of stacks including an organic layer such as a light emitting layer, a hole transport layer, an electron transport layer, an electron injection layer, and a hole injection layer, and a charge generation layer disposed between the plurality of stacks.

The cathode 133 is disposed on the light emitting unit 132. The cathode 133 may supply electrons to the light emitting unit 132 and may be made of a conductive material having a low work function. For example, the cathode 133 may be made of at least one selected from the group consisting of metal such as magnesium (Mg), silver (Ag), aluminum (Al), and calcium (Ca), and alloys thereof, but is not limited thereto.

At this time, in order to direct the light emitted from the light emitting unit 132 to the bottom of the substrate 110, the anode 131 may be made of only a transparent conductive material and the cathode 133 may be made of a metal material having high reflectivity.

Hereinafter, the light emitting element 130 according to an exemplary aspect of the present disclosure will be described in detail with reference to FIG. 3.

Figure 3:
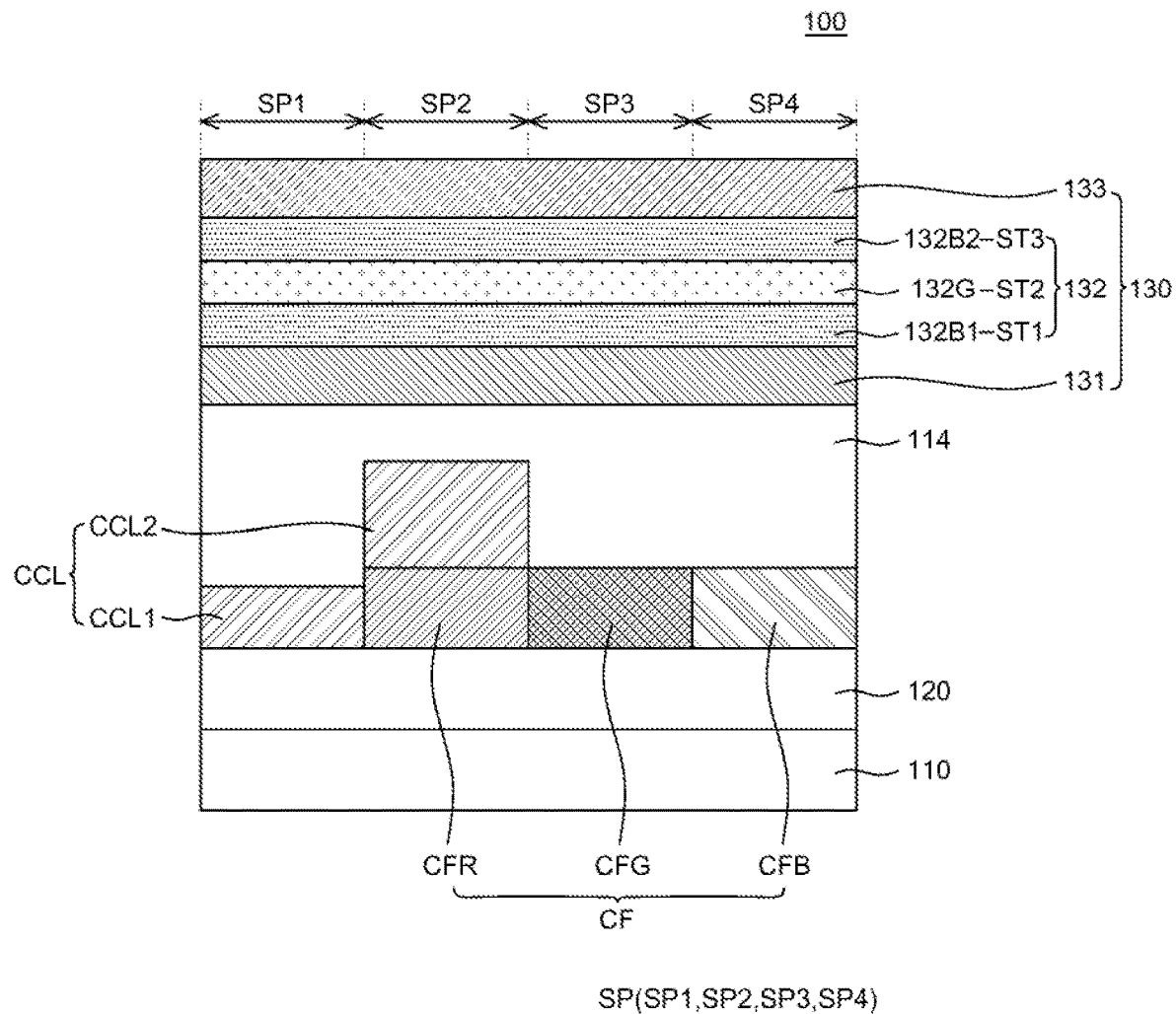
FIG. 3 is a diagram schematically illustrating a structure of a display device according to an exemplary aspect of the present disclosure.

FIG. 3 is a diagram schematically illustrating a structure of the display device according to an exemplary aspect of the present disclosure. In FIG. 3, for convenience of description, only light emitting layers 132B1, 132G, and 132B2 of each configuration of the plurality of stacks ST1, ST2, and ST3 of the light emitting unit 132 have been illustrated.

Referring to FIG. 3, the light emitting unit 132 includes a first stack ST1 including a first blue light emitting layer 132B1, a second stack ST2 including a green light emitting layer 132G, and a third stack ST3 including a second blue light emitting layer 132B2. The light emitted finally from the light emitting unit 132 may be implemented by mixing the light emitted by the first blue light emitting layer 132B1, the green light emitting layer 132G, and the second blue light emitting layer 132B2 of the plurality of stacks ST1, ST2, and ST3, respectively. Therefore, the light emitted from the light emitting unit 132 may include blue light and green light.

The first stack ST1 including the first blue light emitting layer 132B1 is disposed on the anode 131. The first blue light emitting layer 132B1 of the first stack ST1 may emit blue light by the holes and electrons supplied by the anode 131 and the cathode 133. The first blue light emitting layer 132B1 may include a material capable of emitting blue light. In addition, although not illustrated in the drawings, the first stack ST1 may further include an organic layer such as a hole transport layer, an electron transport layer, an electron injection layer, and a hole injection layer, in addition to the first blue light emitting layer 132B1.

The second stack ST2 including the green light emitting layer 132G is disposed on the first stack ST1. The green light emitting layer 132G of the second stack ST2 may emit green light by the holes and electrons supplied by the anode 131 and the cathode 133. The green light emitting layer 132G may include a material capable of emitting green light. In addition, although not illustrated in the drawings, the second stack ST2 may further include an organic layer such as a hole transport layer, an electron transport layer, an electron injection layer, and a hole injection layer, in addition to the green light emitting layer 132G.

The third stack ST3 including the second blue light emitting layer 132B2 is disposed on the second stack ST2. The second blue light emitting layer 132B2 may emit blue light in the same manner as the first blue light emitting layer 132B1. In addition, the second blue light emitting layer 132B2 may also include a material capable of emitting blue light. In addition, although not illustrated in the drawings, the third stack ST3 may further include an organic layer such as a hole transport layer, an electron transport layer, an electron injection layer, and a hole injection layer, in addition to the second blue light emitting layer 132B2.

In addition, although not illustrated in the drawings, a charge generation layer may be disposed between the first stack ST1, the second stack ST2, and the third stack ST3, respectively. The charge generation layer may supply charges to adjacent stacks ST1, ST2, and ST3 to control charge balance.

Meanwhile, since the display device 100 according to an exemplary aspect of the present disclosure is the bottom emission type, the light emitted from the light emitting unit 132 may proceed toward the substrate 110. In addition, the light emitted from the light emitting unit 132 may pass through the plurality of color filters CFs and the plurality of light conversion layers CCLs to be converted into various colors of light.

First, the blue light and the green light from the light emitting unit 132 of the third subpixel SP3 may be implemented as green light by the green color filter CFG. Specifically, the blue light in the blue light and the green light is absorbed in the green color filter CFG and only the green light may pass through the green color filter CFG to proceed toward the substrate 110. Accordingly, the light emitted from the light emitting unit 132 of the third subpixel SP3 may be implemented as green light by the green color filter CFG.

The blue light and the green light from the light emitting unit 132 of the fourth subpixel SP4 may be implemented as blue light by the blue color filter CFB. Specifically, the green light in the blue light and the green light is absorbed in the blue color filter CFB and only the blue light may pass through the blue color filter CFB to proceed toward the substrate 110. Accordingly, the light emitted from the light emitting unit 132 of the fourth subpixel SP4 may be implemented as blue light by the blue color filter CFB.

The blue light and the green light from the light emitting unit 132 of the first subpixel SP1 may be implemented as white light by the first light conversion layer CCL1. In the case of the first light conversion layer CCL1, unlike the color filter CF that converts the color of the light by transmitting only the light having a specific wavelength, the light conversion material absorbs light to emit light of a specific color again so as to convert the color of the light. Therefore, when the blue light and the green light are irradiated from the light emitting unit 132 to the first light conversion layer CCL1, the light conversion material of the first light conversion layer CCL1 may absorb at least some of the blue light and the green light and the light conversion material absorbing the light may emit the red light. In addition, some of the blue light and the green light may pass through the first light conversion layer CCL1 without being absorbed in the light conversion material. Some of the blue light and some of the green light passing through the first light conversion layer CCL1 and the red light emitted from the light conversion material are mixed to finally implement the white light. Accordingly, in the first subpixel SP1, the first light conversion layer CCL1 that absorbs at least some of the blue light and the green light to emit the red light may be disposed to implement the white light.

The blue light and the green light from the light emitting unit 132 of the second subpixel SP2 may be implemented as red light by the second light conversion layer CCL2 and the red color filter CFR. Like the first light conversion layer CCL1, the second light conversion layer CCL2 may also absorb the light to emit the red light. Specifically, the blue light and the green light from the light emitting unit 132 may face the second light conversion layer CCL2 and the light conversion material of the second light conversion layer CCL2 may absorb at least some of the blue light and the green light and then emit the red light. Therefore, some of the blue light and the green light from the light emitting unit 132 may be converted into the red light in the second light conversion layer CCL2. Some of the blue light, some of the green light, and the red light passing through the second light conversion layer CCL2 may face the red color filter CFR. In addition, the blue light and the green light among the blue light, the green light, and the red light from the second light conversion layer CCL2 are absorbed in the red color filter CFR, and only the red light may proceed toward the substrate 110. Accordingly, in the second subpixel SP2, the second light conversion layer CCL2 that absorbs the blue light and the green light to emit the red light and the red color filter CFR transmitting only the red light may be disposed to implement the red light.

At this time, in the second subpixel SP2, the second light conversion layer CCL2 may be disposed more adjacent to the light emitting element 130 than the red color filter CFR. If the red color filter CFR is disposed adjacent to the light emitting element 130, the blue light and the green light from the light emitting element 130 are absorbed in the red color filter CFR, so that the light proceeding toward the second light conversion layer CCL2 may be minimized. That is, if the red color filter CFR is disposed more adjacent to the light emitting element 130 than the second light conversion layer CCL2, the light emitted from the light emitting element 130 is almost absorbed in the red color filter CFR and may not proceed outside the display device 100, so that it is difficult to display an image. Accordingly, the second light conversion layer CCL2 for absorbing the light to emit the red light needs to be disposed more adjacent to the light emitting element 130 than the red color filter CFR, thereby implementing the red light.

In the display device 100 according to an exemplary aspect of the present disclosure, the first light conversion layer CCL1 of the first subpixel SP1 and the second light conversion layer CCL2 of the second subpixel SP2 are designed to have different thicknesses to implement white light with a high color temperature and red light with high luminance. First, the thickness of the first light conversion layer CCL1 is thinly formed to easily implement white light with a high color temperature. The color temperature may be represented by using a color temperature unit, K (Kelvin), as a method of expressing the color of the light as a value. Red-based light sources have a lower color temperature and blue-based light sources have a higher color temperature. At this time, the light conversion efficiency of the first light conversion layer CCL1 may be adjusted to display the white light having a high color temperature in the first subpixel SP1. For example, in order to implement blue-based white light having a high color temperature, a ratio of converting the blue light and the green light into the red light in the first light conversion layer CCL1 needs to be lowered. Therefore, the thickness of the first light conversion layer CCL1 is smaller than that of the second light conversion layer CCL2 to convert at least only the red light for implementing the white light from the blue light and the green light. Accordingly, the blue light and the green light from the light emitting unit 132 are mixed with the red light emitted from the first light conversion layer CCL1 to display the blue-based white light, that is, the white light having the high color temperature.

In the display device 100 according to an exemplary aspect of the present disclosure, in the second subpixel SP2, which is a red subpixel displaying red light, the thickness of the second light conversion layer CCL2 is increased, thereby implementing the red light with high luminance. Since the light emitting unit 132 includes only the first blue light emitting layer 132B1, the green light emitting layer 132G, and the second blue light emitting layer 132B2, only the blue light and the green light may be emitted from the light emitting unit 132. In addition, in order to implement red light with high luminance from such blue light and green light, the ratio of converting the blue light and the green light into the red light needs to be increased. Thus, the thickness of the second light conversion layer CCL2 is increased, thereby increasing a ratio in which the blue light and the green light passing through the second light conversion layer CCL2 are absorbed in the light conversion material to be converted into the red light. Accordingly, since the second light conversion layer CCL2 is formed to be thicker than the first light conversion layer CCL1, the light conversion efficiency of the second light conversion layer CCL2 for converting the blue light and the green light into the red light may be higher than that of the first light conversion layer CCL1.

On the other hand, in the display device 100 according to an exemplary aspect of the present disclosure, the light emitting unit 132 for emitting blue light and green light, the first light conversion layer CCL1 and the second light conversion layer CCL2 having different light conversion efficiency, and the plurality of color filters CFs may be used together to improve the luminance of the display device 100. Hereinafter, an effect of improving the luminance of the light emitting element 130 of the display device 100 according to an exemplary aspect of the present disclosure will be described with reference to FIGS. 4 and 5A-5D together.

Figure 4:
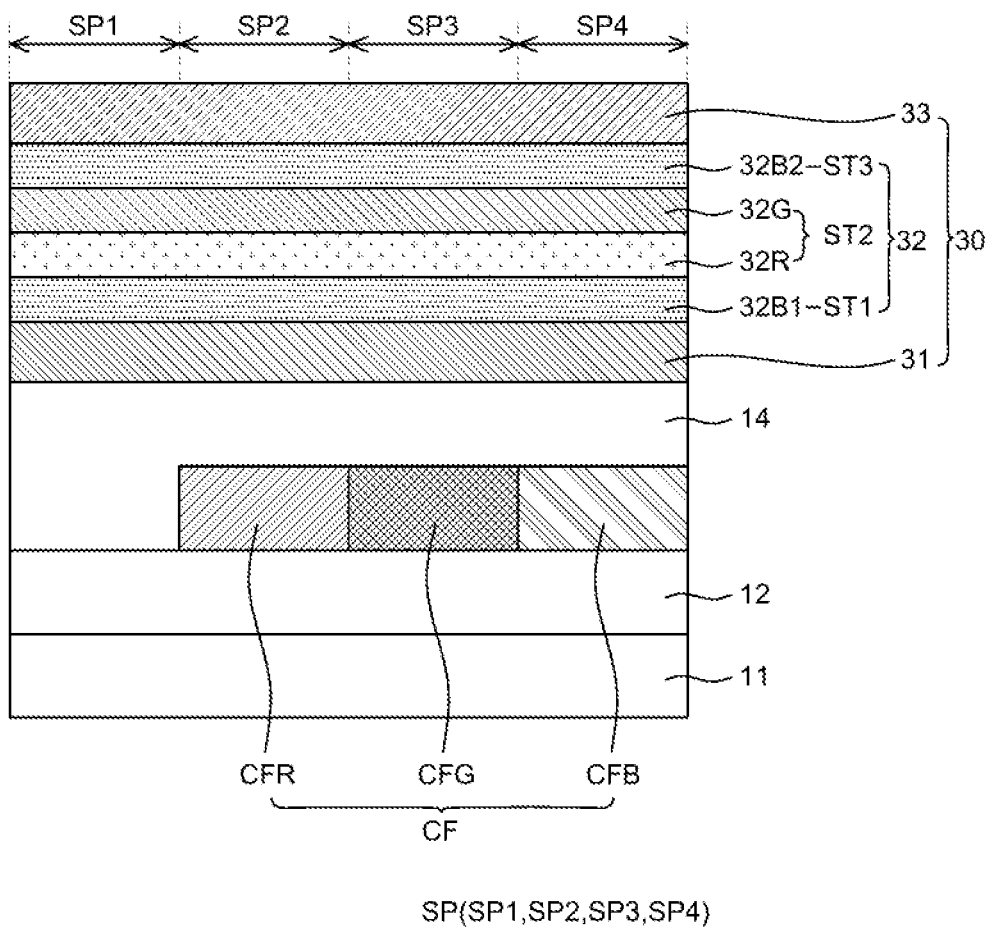
FIG. 4 is a diagram schematically illustrating a structure of a display device according to Comparative aspect.
Figure 5A:
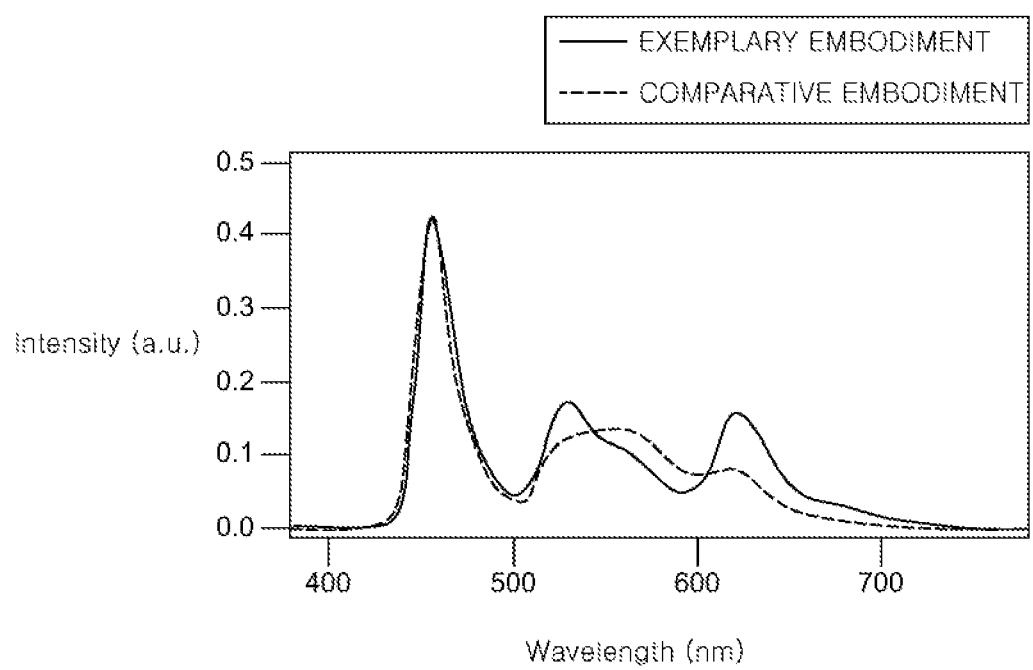
FIGS. 5A to 5D are graphs showing luminance gradients depending on a wavelength in display devices according to Comparative aspect and Exemplary aspect.
Figure 5B:
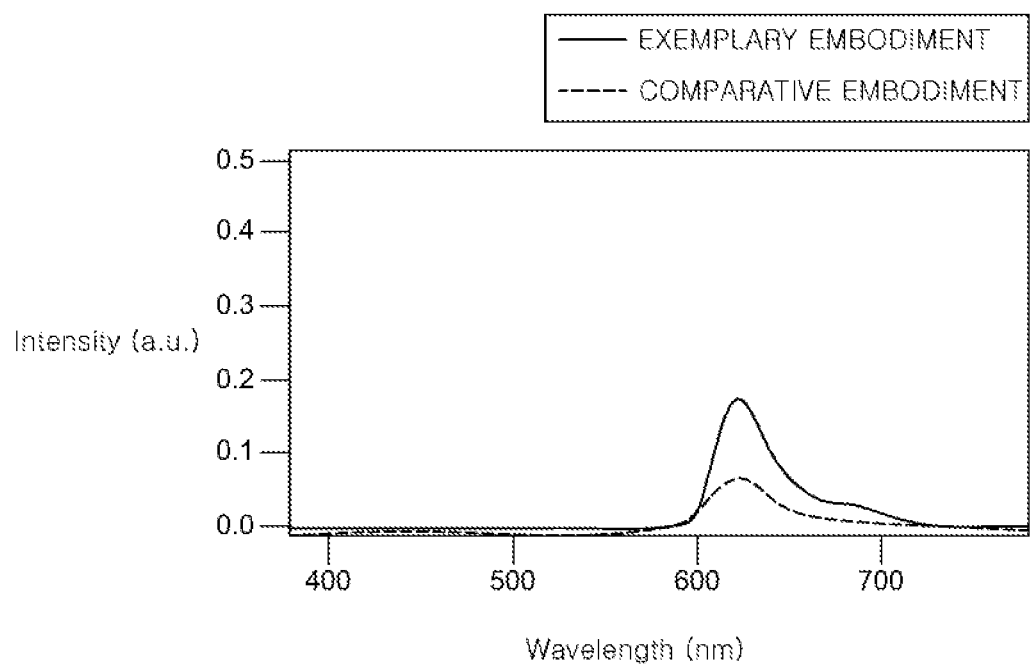
Figure 5C:
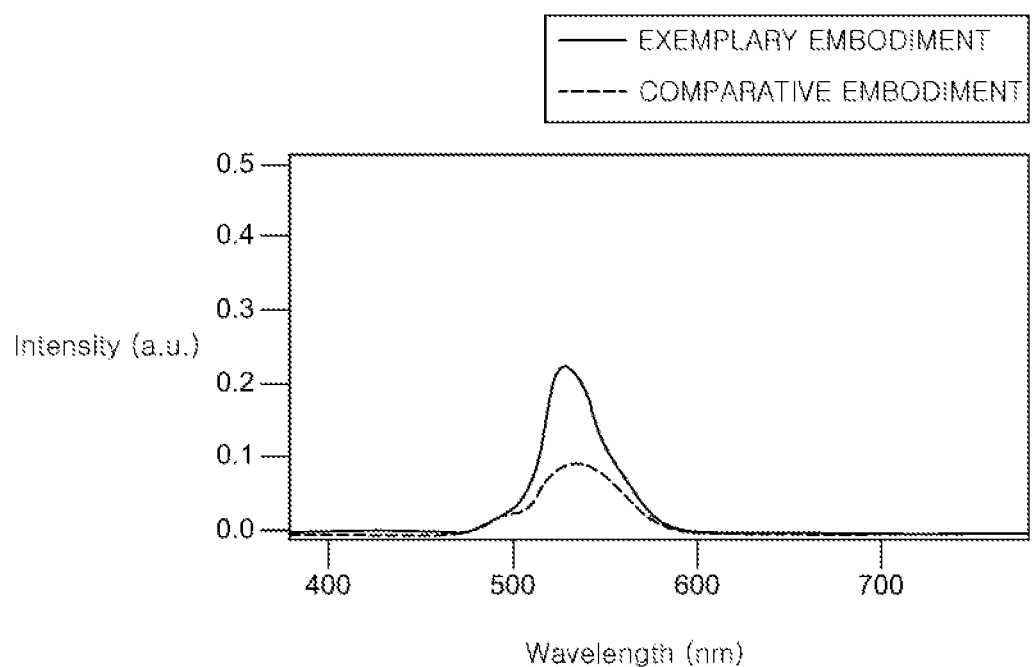
Figure 5D:
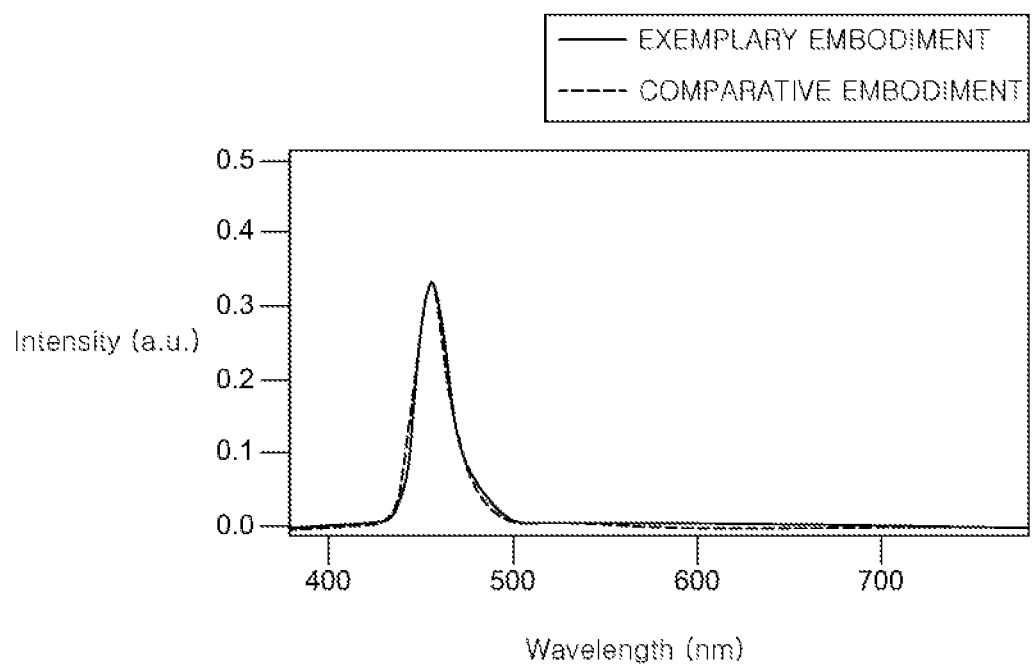

FIG. 4 is a diagram schematically illustrating a structure of a display device according to Comparative aspect. FIGS. 5A to 5D are graphs showing luminance gradients depending on a wavelength in display devices according to Comparative aspect and Exemplary aspect. FIG. 5A is a graph showing a luminance gradient depending on a wavelength in first subpixels SP1 of the display devices 10 and 100 according to Comparative aspect and Exemplary aspect. FIG. 5B is a graph showing a luminance gradient depending on a wavelength in second subpixels SP2 of the display devices 10 and 100 according to Comparative aspect and Exemplary aspect. FIG. 5C is a graph showing a luminance gradient depending on a wavelength in third subpixels SP3 of the display devices 10 and 100 according to Comparative aspect and Exemplary aspect. FIG. 5D is a graph showing a luminance gradient depending on a wavelength in fourth subpixels SP4 of the display devices 10 and 100 according to Comparative aspect and Exemplary aspect.

In FIGS. 5A to 5D, a horizontal axis represents a wavelength (nm), and a vertical axis represents a relative intensity (a.u., that is, arbitrary unit). In FIGS. 5A to 5D, the graphs are graphs of measuring light which is finally implemented in each of the plurality of subpixels SPs of the display devices 10 and 100 according to Comparative aspect and Exemplary aspect.

The display device 100 according to Exemplary aspect is the same display device as the display device 100 according to Exemplary aspect of the present disclosure described with reference to FIGS. 1 to 3.

In addition, referring to FIG. 4, when the display device 10 according to Comparative aspect is compared with the display device 100 according to an exemplary aspect of the present disclosure, the display device 10 has a structure in which a light emitting unit 32 is different and a light conversion layer is not included.

In the display device 10 according to Comparative aspect, on a substrate 11, a transistor 12, a plurality of color filters CFs, and a planarization layer 14 are sequentially disposed, and on the planarization layer 14, the light emitting unit 32 is disposed.

The light emitting unit 32 includes a first stack ST1, a second stack ST2, and a third stack ST3. The first stack ST1 includes a first blue light emitting layer 32B1, the second stack ST2 on the first stack ST1 includes a red light emitting layer 32R and a green light emitting layer 32G, and the third stack ST3 on the second stack ST2 includes a second blue light emitting layer 32B2. Thus, the light emitted finally from the light emitting unit 32 of the display device 10 according to Comparative aspect may be implemented by mixing red light and green light from the red light emitting layer 32R and the green light emitting layer 32G with blue light from the first blue light emitting layer 32B1 and the second blue light emitting layer 32B2. For example, the light emitted from the light emitting unit 32 may be white light in which the blue light, the red light, and the green light are mixed. Meanwhile, in FIG. 4, it has been illustrated that in the second stack ST2, the green light emitting layer 32G is disposed on the red light emitting layer 32R, but the red light emitting layer 32R may also be disposed on the green light emitting layer 32G, but is not limited thereto.

In addition, between the light emitting element 30 and the substrate 11, the light conversion layer CCL is not disposed, but only the plurality of color filters CFs is disposed. In the first subpixel SP1, the color filters CFs and/or the light conversion layer are not disposed, and thus, white light emitted from the light emitting unit 32 may be displayed. In the second subpixel SP2, a red color filter CFR for transmitting only the red light in the white light from the light emitting unit 32 is disposed to display the red light. In the third subpixel SP3, a green color filter CFG for transmitting only the green light in the white light from the light emitting unit 32 is disposed to display the green light. In the fourth subpixel SP4, a blue color filter CFB for transmitting only the blue light in the white light from the light emitting unit 32 is disposed to display the blue light.

[Table 1] is a table illustrated by measuring the luminance of light emitted from each of the plurality of subpixels SPs in the display device 10 according to Comparative aspect and the display device 100 according to an exemplary aspect depending on graphs of FIGS. 5A to 5D.

TABLE 1

|  | Comparative aspect | Exemplary aspect |
| --- | --- | --- |
| Luminance of first subpixel SP1 | 190 nit | 232 nit |
| Luminance of second subpixel SP2 | 171 nit | 266 nit |

TABLE 1-continued

|  | Comparative aspect | Exemplary aspect |
|---|---|---|
| Luminance of third subpixel SP3 | 191 nit | 422 nit |
| Luminance of fourth subpixel SP4 | 272 nit | 288 nit |

Hereinafter, referring to FIGS. 5A to 5D and Table 1, results of measuring the luminance of light emitted from each of the plurality of subpixels SPs in the display device 10 according to Comparative aspect and the display device 100 according to an exemplary aspect will be described.

First, referring to Table 1, it was confirmed that in the display device 100 according to an exemplary aspect, the luminance of the final product was 232 nit, and in the display device 10 according to Comparative aspect, the luminance of the final product was 171 nit, and as a result, the display device 100 according to an exemplary aspect was increased in luminance compared with the display device 10 according to Comparative aspect. At this time, the luminance of the final product may be defined as the lowest luminance in the luminance of each of the plurality of subpixels SPs.

Referring to FIG. 5A, a wavelength of light emitted from the first subpixel SP1 of the display device 10 according to Comparative aspect may have peaks at about 470 nm, 530 nm and 630 nm. In addition, a wavelength of light emitted from the first subpixel SP1 of the display device 100 according to an exemplary aspect may have peaks at about 470 nm, 530 nm and 630 nm. As a result, the wavelengths of the light emitted from the first subpixels SP1 of the display devices 10 and 100 according to Comparative aspect and an exemplary aspect have peaks at 470 nm corresponding to a wavelength range of blue light, 530 nm corresponding to a wavelength range of green light, and 630 nm corresponding to a wavelength range of red light, respectively, to be white light.

At this time, in the display device 10 according to Comparative aspect, since the red light and the green light are emitted from the red light emitting layer 32R and the green light emitting layer 32G of one second stack ST2, the red light and the green light may have a trade-off relation. When the red light emitting layer 32R and the green light emitting layer 32G are disposed together in one second stack ST2, the performance of the red light emitting layer 32R and the performance of the green light emitting layer 32G may have a trade-off relation. For example, when the luminance of the red light emitting layer 32R is improved, the luminance of the green light emitting layer 32G may be lowered, and when the luminance of the green light emitting layer 32G is improved, the luminance of the red light emitting layer 32R may be lowered. Thus, when the red light emitting layer 32R and the green light emitting layer 32G are disposed in the second stack ST2 together, it is difficult to secure the luminance of the green light having a peak at about 530 nm or the luminance of the red light having a peak at about 630 nm to a predetermined level or more. On the other hand, in the display device 100 according to an exemplary aspect, since only one green light emitting layer 132G is disposed in the second stack ST2, it is possible to overcome a limitation according to trade-off and improve the luminance of the green light having a peak at about 530 nm. Accordingly, in the graph of FIG. 5A, the display device 100 according to an exemplary aspect may have a higher intensity than the display device 10 according to Comparative aspect around about 530 nm corresponding to the green light.

Further, in the display device 100 according to an exemplary aspect, since some of the blue light and the green light are converted into red light by the first light conversion layer CCL1, the light conversion efficiency of the first light conversion layer CCL1 may be adjusted to control the luminance, that is, the intensity of the red light. On the other hand, in the display device 10 according to Comparative aspect, since the light conversion layer is not disposed in the first subpixel SP1, the white light may be implemented only by the light emitted from the light emitting unit 32. In addition, as described above, in the display device 10 according to Comparative aspect, since the red light emitting layer 32R and the green light emitting layer 32G disposed in one second stack ST2 together have a trade-off relation, the luminance of the green light may be lowered by increasing the luminance of the red light. That is, unlike the display device 100 according to an exemplary aspect capable of easily ensuring the red light by the first light conversion layer CCL1, in the display device 10 according to Comparative aspect, the red light depends on only the red light emitting layer 32R. In addition, in the display device 10 according to Comparative aspect, there is a limitation to emit the red light at a predetermined level or higher in the red light emitting layer 32R by the trade-off relation between the red light emitting layer 32R and the green light emitting layer 32G and it may be difficult to ensure the sufficient red light. Accordingly, in the graph of FIG. 5A, the display device 100 according to an exemplary aspect may have a higher intensity than the display device 10 according to Comparative aspect around about 630 nm corresponding to the red light. Therefore, the first subpixel SP1 of the display device 100 according to an exemplary aspect implements the red light and the green light at a stronger intensity than the first subpixel SP1 of the display device 10 according to Comparative aspect, thereby finally ensuring white light with higher luminance.

Next, referring to FIG. 5B, the wavelength of the light emitted from the second subpixel SP2 of the display device 10 according to Comparative aspect may have a peak at about 630 nm. In addition, the wavelength of the light emitted from the second subpixel SP2 of the display device 100 according to an exemplary aspect may also have a peak at about 630 nm. Accordingly, each of the wavelengths of the light emitted from the second subpixels SP2 of the display devices 10 and 100 according to Comparative aspect and an exemplary aspect may also have a peak at about 630 nm to be red light.

Referring to Table 1 together, the luminance of the light emitted from the second subpixel SP2 of the display device 10 according to Comparative aspect is 171 nit and the luminance of the light emitted from the second subpixel SP2 of the display device 100 according to an exemplary aspect is 266 nit. Therefore, the luminance of the second subpixel SP2 in the display device 100 according to an exemplary aspect may be higher than the luminance of the second subpixel SP2 in the display device 10 according to Comparative aspect.

Specifically, in the display device 100 according to an exemplary aspect, some of the blue light and the green light emitted from the light emitting unit 132 are converted into the red light in the second light conversion layer CCL2. The red light converted by the second light conversion layer CCL2 pass through the red color filter CFR and the blue light and the green light which are not converted absorbed by the red color filter CFR and may be implemented as red light with high purity. In the display device 100 according to an exemplary aspect, the blue light and the green light emitted from the light emitting unit 132 are maximally converted into the red light, thereby minimizing the light lost in the red color filter CFR.

On the other hand, in the display device 10 according to Comparative aspect, since only the red color filter CFR is disposed in the second subpixel SP2, only the red light of the blue light, the green light, and the red light emitted from the light emitting unit 32 passes through the red color filter CFR and the blue light and the green light are absorbed in the red color filter CFR not to proceed outside the display device 10. That is, the luminance of the second subpixel SP2 of the display device 10 according to Comparative aspect may be determined only by the red light emitted from the red light emitting layer 32R of the second stack ST2 of the light emitting unit 32. In the display device 10 according to Comparative aspect, the blue light and the green light may not be emitted to the outside of the display device by the red color filter CFR. However, in the display device 100 according to an exemplary aspect, the blue light and the green light are converted into the red light to pass through the red color filter CFR, so that the luminance of the second subpixel SP2 may be further increased in the display device 100 according to an exemplary aspect. Accordingly, in the display device 10 according to Comparative aspect, the blue light and the green light are lost in the red color filter CFR of the second subpixel SP2. However, in the display device 100 according to an exemplary aspect, the blue light and the green light are converted into the red light and emitted, thereby reducing the light lost in the red color filter CFR and improving the luminance of the red light.

Referring to FIG. 5C, the wavelength of the light emitted from the third subpixel SP3 of the display device 10 according to Comparative aspect may have a peak at about 530 nm. In addition, the wavelength of the light emitted from the third subpixel SP3 of the display device 100 according to an exemplary aspect may also have a peak at about 530 nm. Accordingly, each of the wavelengths of the light emitted from the third subpixels SP3 of the display devices 10 and 100 according to Comparative aspect and an exemplary aspect may also have a peak at about 530 nm to be green light.

Referring to Table 1 together, the luminance of the light emitted from the third subpixel SP3 of the display device 10 according to Comparative aspect is 191 nit and the luminance of the light emitted from the third subpixel SP3 of the display device 100 according to an exemplary aspect is 422 nit. That is, the luminance of the third subpixel SP3 in the display device 100 according to an exemplary aspect may be higher than the luminance of the third subpixel SP3 in the display device 10 according to Comparative aspect.

Specifically, the red light emitting layer 32R and the green light emitting layer 32G are disposed together in the second stack ST2 of the light emitting unit 32 of the display device 10 according to Comparative aspect. In addition, the red light emitting layer 32R and the green light emitting layer 32G disposed together in one second stack ST2 may have a trade-off relation. By this trade-off relation, in the case of enhancing the luminance of the red light emitted from one second stack ST2, the luminance of the green light may be decreased, and in the case of enhancing the luminance of the green light, the luminance of the red light may be decreased. As a result, in the display device 10 according to Comparative aspect as a structure in which the light emitting unit 32 disposed in each of the plurality of subpixels SPs is integrally formed, in the case of enhancing the luminance of the second subpixel SP2, the luminance of the third subpixel SP3 emitting the green light may be lowered. In addition, in the case of enhancing the luminance of the third subpixel SP3, the luminance of the second subpixel SP2 may be lowered. Accordingly, in the display device 10 according to Comparative aspect, the red light and the green light are implemented by one second stack ST2, so that it is difficult to implement the luminance of the light emitted from the second subpixel SP2 and the third subpixel SP3 at a predetermined level or higher.

On the other hand, in the display device 100 according to an exemplary aspect, the light emitting unit 132 emits only the green light and the blue light and the red light is implemented by the second light conversion layer CCL2 and the red color filter CFR, thereby separately controlling the luminance of the second subpixel SP2 and the luminance of the third subpixel SP3. Referring to FIG. 5B, as described above, in the second subpixel SP2 of the display device 10 according to Comparative aspect, both the blue light and the green light are absorbed in the red color filter CFR, so that the luminance of the second subpixel SP2 is determined only by the red light emitted from the red light emitting layer 32R of the second stack ST2. In the third subpixel SP3, the luminance of the third subpixel SP3 may be determined by the green light emitted from the green light emitting layer 32G of the second stack ST2. However, in the second subpixel SP2 of the display device 100 according to an exemplary aspect, the blue light and the green light from the light emitting unit 132 are converted into red light by the second light conversion layer CCL2 to be not absorbed in the red color filter CFR, thereby minimizing the light amount to be lost. Further, in the second stack ST2 of the light emitting unit 132 of the display device 100 according to an exemplary aspect, since only the green light emitting layer 132G is disposed, the green light emitted from the light emitting unit 132 may be increased as compared with Comparative aspect, so that the luminance of the third subpixel SP3 may be increased. In the display device 100 according to an exemplary aspect, it is possible to control the luminance of the second subpixel SP2 by the second light conversion layer CCL2 and the red color filter CFR and to control the luminance of the third subpixel SP3 by the green light emitting layer 132G of the light emitting unit 132. Accordingly, unlike the display device 10 according to Comparative aspect including the red light emitting layer 32R and the green light emitting layer 32G having the trade-off relation which are disposed in one second stack ST2, in the display device 100 according to an exemplary aspect, the red light and the green light are separately controlled to have no trade-off relation, thereby easily improving the luminance of the second subpixel SP2 and the third subpixel SP3.

Next, referring to FIG. 5D, the wavelength of the light emitted from the fourth subpixel SP4 of the display device 10 according to Comparative aspect may have a peak at about 470 nm. In addition, the wavelength of the light emitted from the fourth subpixel SP4 of the display device 100 according to an exemplary aspect may also have a peak at about 470 nm. Accordingly, each of the wavelengths of the light emitted from the fourth subpixels SP4 of the display devices 10 and 100 according to Comparative aspect and an exemplary aspect may also have a peak at about 470 nm to be blue light.

Referring to Table 1 together, the luminance of the light emitted from the fourth subpixel SP4 of the display device 10 according to Comparative aspect is 272 nit and the luminance of the light emitted from the fourth subpixel SP4 of the display device 100 according to an exemplary aspect may be 288 nit which is a similar level. Both the luminance of the fourth subpixels SP4 of the display device 10 and the display device 100 according to Comparative aspect and an exemplary aspect are determined by the first blue light emitting layers 32B1 and 132B1 and the second blue light emitting layers 32B2 and 132B2 of the first stack ST1 and the third stack ST3 of the light emitting unit 32 and 132, respectively. Thus, the luminance of the fourth subpixel SP4 in the display device 100 according to an exemplary aspect may be similar to the luminance of the fourth subpixel SP4 in the display device 10 according to Comparative aspect.

In the display device 100 according to an exemplary aspect of the present disclosure, the second light conversion layer CCL2 and the red color filter CFR are disposed in the second subpixel SP2 and the light emitting unit 132 includes the green light emitting layer 132G, thereby improving the luminance of the display device 100. In the case of the display device 10 according to Comparative aspect, the red light emitting layer 32R and the green light emitting layer 32G are disposed in one second stack ST2 to have a trade-off relation. Therefore, when the efficiency of the red light emitting layer 32R is increased, the efficiency of the green light emitting layer 32G is lowered, and when the efficiency of the green light emitting layer 32G is increased, the efficiency of the red light emitting layer 32R is lowered, so that there was a limitation in improving the luminance. Unlike this, in the display device 100 according to an exemplary aspect of the present disclosure, the second light conversion layer CCL2 that converts the blue light and green light emitted from the light emitting unit 132 into the red light is disposed in the second subpixel SP2, thereby minimizing the light absorbed and lost in the red color filter CFR. At this time, the thickness of the second light conversion layer CCL2 is configured to be at least larger than that of the first light conversion layer CCL1, thereby increasing the ratio of converting the blue light and the green light emitted from the light emitting unit 132 into the red light and improving the luminance of the red light displayed finally in the second subpixel SP2. Further, as compared with Comparative aspect in which the red light emitting layer 32R and the green light emitting layer 32G are disposed in one second stack ST2, in the second stack ST2 of the light emitting unit 132 of the display device 100 according to an exemplary aspect of the present disclosure, the green light emitting layer 132G emitting only the green light is disposed. Accordingly, the green light emitted from the light emitting unit 132 may be increased and the luminance of the third subpixel SP3 may be increased. Accordingly, in the display device 100 according to an exemplary aspect of the present disclosure, the second light conversion layer CCL2 and the red color filter CFR are disposed in the second subpixel SP2 to control the luminance of the second subpixel SP2 displaying the red light. In addition, only one green light emitting layer 132G is disposed in the second stack ST2 of the light emitting unit 132 to control the luminance of the third subpixel SP3 displaying the green light, thereby improving the overall luminance of the display device 100.

Figure 6:
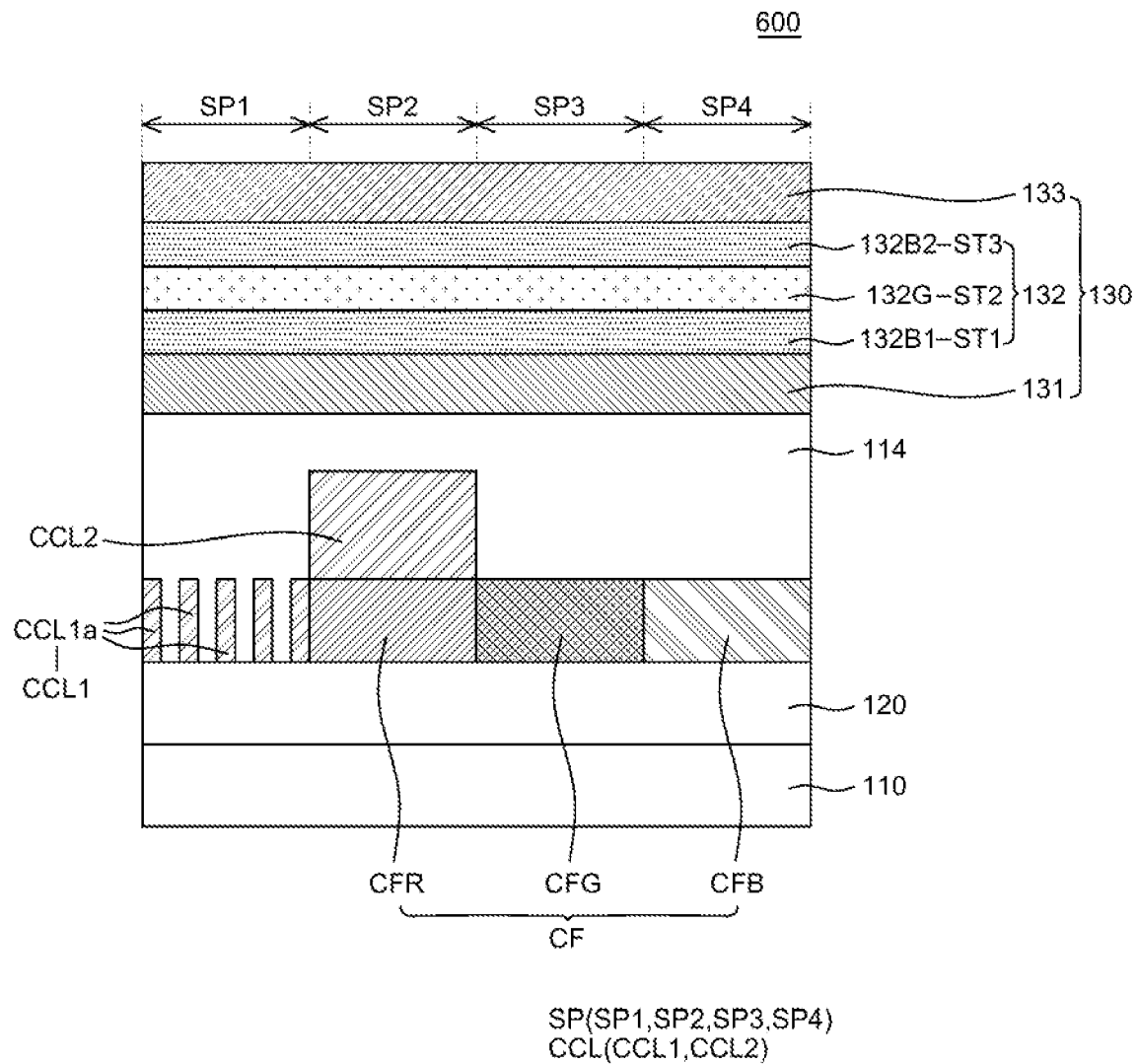
FIG. 6 is a diagram schematically illustrating a structure of a display device according to another exemplary aspect of the present disclosure.

FIG. 6 is a diagram schematically illustrating a structure of a display device according to another exemplary aspect of the present disclosure. As compared with the display device 100 of FIGS. 1 to 3, a display device 600 of FIG. 6 is substantially the same as the display device 100 in other configurations except that a first light conversion layer CCL1 is different, and thus, the duplicated description will be omitted.

Referring to FIG. 6, the first light conversion layer CCL1 includes a plurality of first light conversion layer patterns CCL1a. The plurality of first light conversion layer patterns CCL1a may be disposed to be spaced apart from each other. The first light conversion layer CCL1 is configured by the plurality of first light conversion layer patterns CCL1a spaced apart from each other to easily control the light conversion efficiency of the first light conversion layer CCL1.

As an interval between the first light conversion layer patterns CCL1a is decreased, that is, an empty space between the first light conversion layer patterns CCL1a is decreased, a probability that the blue light and the green light from the light emitting unit 132 are to be incident to the first light conversion layer CCL1 may be increased. Thus, in the first light conversion layer CCL1, a ratio at which the blue light and the green light are converted into red light may be increased.

On the contrary, as the interval between the first light conversion layer patterns CCL1a is increased, that is, the empty space between the first light conversion layer patterns CCL1a is increased, a probability that the blue light and the green light from the light emitting unit 132 are to be incident to the first light conversion layer CCL1 may be decreased. Thus, in the first light conversion layer CCL1, the ratio at which the blue light and the green light are converted into the red light may be decreased.

In this case, according to the light conversion efficiency design of the first light conversion layer CCL1, the thickness of each of the first light conversion layer patterns CCL1a may be different from or equal to the thickness of the second light conversion layer CCL2. For example, the interval between the first light conversion layer patterns CCL1a is widened, or the thickness of each of the first light conversion layer patterns CCL1a is smaller than the thickness of the second light conversion layer CCL2, thereby lowering the light conversion efficiency of the first light conversion layer CCL1. For example, the interval between the first light conversion layer patterns CCL1a is narrowed, or the thickness of each of the first light conversion layer patterns CCL1a is larger than the thickness of the second light conversion layer CCL2, thereby improving the light conversion efficiency of the first light conversion layer CCL1.

In addition, according to the light conversion efficiency design of the first light conversion layer CCL1, the concentration of a light conversion material of each of the first light conversion layer patterns CCL1a may be different from or equal to the concentration of the light conversion material of the second light conversion layer CCL2. For example, the interval between the first light conversion layer patterns CCL1a is widened, or the concentration of the light conversion material of each of the first light conversion layer patterns CCL1a is smaller than the concentration of the light conversion material of the second light conversion layer CCL2, thereby lowering the light conversion efficiency of the first light conversion layer CCL1. For example, the interval between the first light conversion layer patterns CCL1a is narrowed, or the concentration of the light conversion material of each of the first light conversion layer patterns CCL1a is larger than the concentration of the light conversion material of the second light conversion layer CCL2, thereby improving the light conversion efficiency of the first light conversion layer CCL1.

In addition, according to the light conversion efficiency design of the first light conversion layer CCL1, the light conversion material of each first light conversion layer CCL1 may be different from or equal to the light conversion material of the second light conversion layer CCL2. For example, the interval between the first light conversion layer patterns CCL1a is widened, or the light conversion material of the first light conversion layer patterns CCL1a is configured as a light conversion material having lower efficiency than the light conversion material of the second light conversion layer CCL2, thereby lowering the light conversion efficiency of the first light conversion layer CCL1. For example, the interval between the first light conversion layer patterns CCL1a is narrowed, or the light conversion material of the first light conversion layer patterns CCL1a is configured as a light conversion material having higher efficiency than the light conversion material of the second light conversion layer CCL2, thereby improving the light conversion efficiency of the first light conversion layer CCL1.

Accordingly, considering the interval between the first light conversion layer patterns CCL1a, the thicknesses of the first light conversion layer CCL1 and the second light conversion layer CCL2, the concentration of the light conversion material of each of the first light conversion layer CCL1 and the second light conversion layer CCL2, and a type of light conversion material may be equally or differently configured, but are not limited thereto. As an example, a thickness of the first light conversion layer CCL1 may be smaller than a thickness of the second light conversion layer CCL2, and in this case, a concentration of the light conversion material in the first light conversion layer CCL1 may be equal to a concentration of the light conversion material in the second light conversion layer CCL2. Alternatively, a thickness of the first light conversion layer CCL1 may be equal to a thickness of the second light conversion layer CCL2, and in this case, a concentration of the light conversion material in the first light conversion layer CCL1 may be lower than a concentration of the light conversion material in the second light conversion layer CCL2.

In the display device 600 according to another exemplary aspect of the present disclosure, the first light conversion layer CCL1 is configured by the plurality of first light conversion layer patterns CCL1a spaced apart from each other to easily control the light conversion efficiency of the first light conversion layer CCL1. For example, when the interval between the first light conversion layer patterns CCL1a is widened, a probability that the blue light and the green light of the light emitting unit 132 are incident to the first light conversion layer CCL1 may be decreased, and a ratio to be converted into red light in the first light conversion layer CCL1 may be lowered. For example, when the interval between the first light conversion layer patterns CCL1a is narrowed, the probability that the blue light and the green light of the light emitting unit 132 are incident to the first light conversion layer CCL1 may be increased, and the ratio to be converted into red light in the first light conversion layer CCL1 may be increased. Accordingly, in the display device 600 according to another exemplary aspect of the present disclosure, the first light conversion layer CCL1 is configured by the plurality of first light conversion layer patterns CCL1a, thereby easily controlling the light conversion efficiency of the first light conversion layer CCL1 and the color temperature of the white light.

Figure 7:
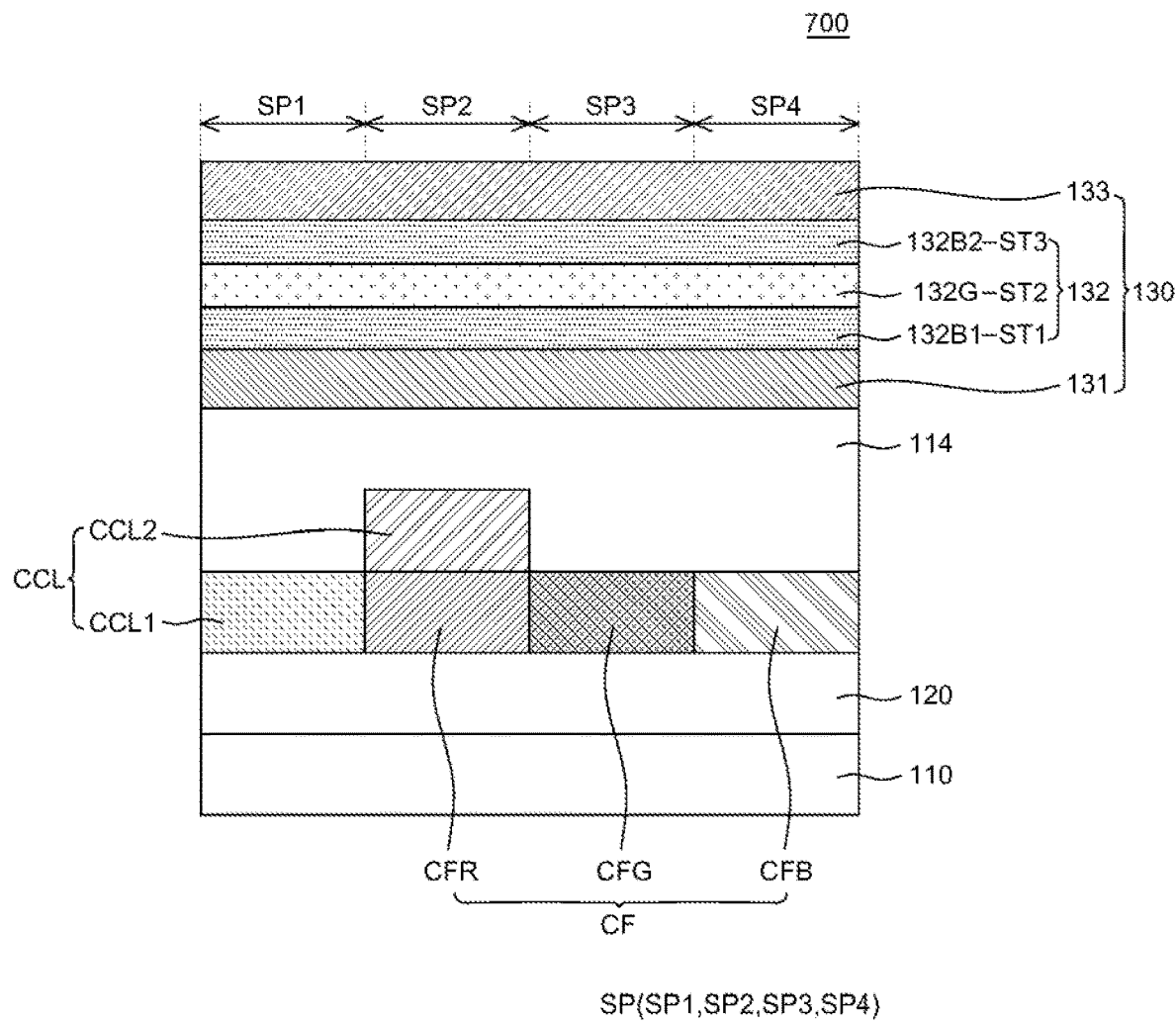
FIG. 7 is a diagram schematically illustrating a structure of a display device according to yet another exemplary aspect of the present disclosure.

FIG. 7 is a diagram schematically illustrating a structure of a display device according to yet another exemplary aspect of the present disclosure. As compared with the display device 100 of FIGS. 1 to 3, a display device 700 of FIG. 7 is substantially the same as the display device 100 in other configurations except that a first light conversion layer CCL1 and a second light conversion layer CCL2 are different, and thus, the duplicated description will be omitted.

The first light conversion layer CCL1 includes a base member and a first light conversion material. The first light conversion layer CCL1 may be formed of the base member in which the first light conversion material is distributed. In addition, the second light conversion layer CCL2 also includes a base member and a second light conversion material. The second light conversion layer CCL2 may be formed of the base member in which the second light conversion material is distributed. In this case, the first light conversion material and the second light conversion material may be different materials.

The first light conversion material may be a material having higher efficiency of converting green light into red light than the efficiency of converting blue light into red light. Specifically, the first light conversion layer CCL1 is disposed in the first subpixel SP1, which is a white subpixel SP, to convert some of the blue light and the green light from the light emitting unit 132 into red light, thereby implementing white light. At this time, the color temperature of the white light may be controlled by adjusting the ratio of blue light, green light, and red light forming the white light. For example, when the color temperature of the white light is increased to implement blue-based white light, the blue light may occupy the largest ratio and the red light may occupy the smallest ratio. At this time, in order to implement the white light having the high color temperature, the ratio of converting the green light into the red light needs to be higher than the ratio of converting the blue light in the blue light and green light emitted from the light emitting unit 132 into the red light, thereby increasing the ratio of occupying the blue light in the white light. If the blue light is more converted to the red light than the green light in the first light conversion layer CCL1, the ratio of occupying the blue light in the white light may be finally reduced and it is difficult to implement the white light having a high color temperature. As a result, the first light conversion material may be made of a material having higher efficiency of converting the green light into the red light than the efficiency of converting the blue light into the red light.

The second light conversion material may be a material having higher efficiency of converting the blue light into the red light than the first light conversion material. In addition, the second light conversion material may be a material having excellent both the efficiency of converting the green light into the red light and the efficiency of converting the blue light into the red light. The second light conversion layer CCL2 is disposed in the second subpixel SP2, which is a red subpixel SP, to convert some of the blue light and the green light from the light emitting unit 132 into red light, thereby implementing red light. At this time, the remaining light of the blue light and the green light that is not converted into the red light in the second light conversion layer CCL2 is absorbed in the red color filter CFR and may not proceed to the outside of the display device 700. That is, the blue light and the green light that are not converted into the red light in the second light conversion layer CCL2 may be lost by the red color filter CFR, resulting in a decrease in luminance of the second subpixel SP2. Thus, the second light conversion material of the second light conversion layer CCL2 may be made of a material having excellent efficiency of converting the blue light and the green light into the red light, and may be made of a material having higher efficiency of converting the blue light into the red light than at least the first light conversion material. As the efficiency of converting the blue light and the green light into the red light of the second light conversion material is increased, the light absorbed and lost in the red color filter CFR may be reduced and the luminance of the red light displayed finally in the second subpixel SP2 may be improved.

The first light conversion material and the second light conversion material may be configured differently in the material or size. When the first light conversion material and the second light conversion material are made of different materials, each of the first light conversion material and the second light conversion material may be made of any one of quantum dot materials such as InAs, InP, or Pbs, but is not limited thereto.

When the first light conversion material and the second light conversion material are made of the same material, the sizes of the first light conversion material and the second light conversion material may be different from each other. In the case of quantum dots, as the size, i.e., the diameter is increased, light close to red light may be emitted, and as the diameter is decreased, light close to blue light may be emitted. For example, if the diameter of the quantum dot is 2 nm, that is, the size of about 15 atoms, the quantum dots may be blue quantum dots, if the diameter of the quantum dot is 3 nm, that is, the size of about 30 atoms, the quantum dots may be green quantum dots, and if the diameter of the quantum dot is 7 nm, that is, the size of about 150 atoms, the quantum dots may be red quantum dots. Therefore, in the case of the second light conversion layer having relatively high efficiency of converting blue light and green light into red light, the second light conversion layer may have a larger size than the first light conversion layer. Thus, the sizes of the first light conversion material and the second light conversion material may be different from each other, so that the red light conversion efficiency of each of the first light conversion material and the second light conversion material may be designed differently.

Additionally, in the case of the second light conversion layer CCL2, in order to increase the ratio of converting blue light and green light into red light, the concentration of the second light conversion material is highly configured or the thickness of the second light conversion layer CCL2 is configured to be thicker, thereby further improving the light conversion efficiency.

In the display device 700 according to yet another exemplary aspect of the present disclosure, the first light conversion material of the first second light conversion layer CCL1 and the second light conversion material of the second light conversion layer CCL2 may be differently configured based on the characteristic of each subpixel SP. In the case of the first subpixel SP1, in order to implement the white light having a high color temperature, the ratio at which the green light in the blue light and the green light from the light emitting unit 132 is converted into the red light may be configured to be higher than the ratio of converting the blue light into the red light. The white light having the high color temperature is blue-based white light, and as the ratio of occupying the blue light among blue light, green light, and red light mixed to form the white light is increased, the color temperature may be increased. As a result, the first light conversion layer CCL1 is made of the first light conversion material which has a higher ratio of converting the green light into the red light than the ratio of converting the blue light into the red light, thereby implementing white light having a higher color temperature. In the case of the second subpixel SP2, the blue light and the green light from the light emitting unit 132 are maximally converted into the red light in the second light conversion layer CCL2 to reduce the light lost in the red color filter CFR, thereby implementing red light with high luminance. That is, the second light conversion material of the second light conversion layer CCL2 is configured by a material having high efficiency of converting both the green light and the blue light into the red light to maximally convert the light emitted from the light emitting unit 132 into the red light. Therefore, it is possible to minimize the light absorbed and lost in the red color filter CFR and improve the luminance of the red light displayed finally in the second subpixel SP2. Accordingly, in the display device 700 according to yet another exemplary aspect of the present disclosure, the first light conversion material and the second light conversion material of the first light conversion layer CCL1 and the second light conversion layer CCL2 are differently configured to implement red light with high luminance while implementing white light having a high color temperature, thereby improving the display quality of the display device 700.

The exemplary aspects of the present disclosure can also be described as follows:

According to an aspect of the present disclosure, a display device includes a light emitting element which is disposed in each of a plurality of subpixels and includes a first blue light emitting layer, a green light emitting layer on the first blue light emitting layer, and a second blue light emitting layer on the green light emitting layer; a first light conversion layer disposed in a first subpixel among the plurality of subpixels; and a second light conversion layer disposed in a second subpixel among the plurality of subpixels and having higher light conversion efficiency than the first light conversion layer.

The first light conversion layer and the second light conversion layer may convert light emitted from the first blue light emitting layer, the green light emitting layer, and the second blue light emitting layer into red light.

A thickness of the first light conversion layer may be smaller than a thickness of the second light conversion layer.

Each of the first light conversion layer and the second light conversion layer may include a base member; and a light conversion material distributed in the base member. A concentration of the light conversion material in the first light conversion layer may be lower than a concentration of the light conversion material in the second light conversion layer.

The first light conversion layer may consist of a plurality of first light conversion layer patterns spaced apart from each other.

The first light conversion layer may have higher efficiency of converting green light into red light than the efficiency of converting blue light into red light.

The second light conversion layer may have higher efficiency of converting blue light into red light than the first light conversion layer.

The display device may further comprise a red color filter disposed to overlap with the second light conversion layer. The second light conversion layer may be disposed more adjacent to the light emitting element than the red color filter.

On a cross section, a width of the second light conversion layer may be smaller than or equal to a width of the red color filter.

The first subpixel may be a white subpixel, and the second subpixel may be a red subpixel.

According to another aspect of the present disclosure, the display device includes a light emitting unit disposed in a plurality of subpixels including a plurality of white subpixels and a plurality of red subpixels and including a light emitting layer emitting blue light and a light emitting layer emitting green light; a first light conversion layer disposed in the plurality of white subpixels to convert the light emitted from the light emitting unit into red light; and a second light conversion layer disposed in the plurality of red subpixels to convert the light emitted from the light emitting unit into red light, in which the light conversion efficiency of the second light conversion layer is higher than the light conversion efficiency of the first light conversion layer.

The first light conversion layer and the second light conversion layer may include a light conversion material coated on a base member.

A thickness of the first light conversion layer may be smaller than a thickness of the second light conversion layer, and a concentration of the light conversion material in the first light conversion layer may be equal to a concentration of the light conversion material in the second light conversion layer.

A thickness of the first light conversion layer may be equal to a thickness of the second light conversion layer, and a concentration of the light conversion material in the first light conversion layer may be lower than a concentration of the light conversion material in the second light conversion layer.

The light conversion material may include a first light conversion material disposed in the first light conversion layer; and a second light conversion material disposed in the second light conversion layer and having a different material or size from the first light conversion material. The first light conversion material may have a higher efficiency of converting green light into red light than an efficiency of converting blue light into red light.

The second light conversion material may have a higher efficiency of converting blue light into red light than the first light conversion material.

The first light conversion layer may include a plurality of first light conversion layer patterns disposed on one white subpixel of the plurality of white subpixels, and the plurality of first light conversion layer patterns may be spaced apart from each other.

The display device may further include a red color filter disposed below the second light conversion layer in each of the plurality of red subpixels. On a plane, a size of the red color filter may be larger than or equal to a size of the second light conversion layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a light emitting element disposed in each of a plurality of subpixels and including a first blue light emitting layer, a green light emitting layer on the first blue light emitting layer, and a second blue light emitting layer on the green light emitting layer;
   a first light conversion layer disposed in a white subpixel among the plurality of subpixels;
   a second light conversion layer disposed in a red subpixel among the plurality of subpixels and having higher light conversion efficiency than the first light conversion layer; and
   a red color filter disposed to overlap with the second light conversion layer,
   wherein the first light conversion layer and the second light conversion layer convert light emitted from the first blue light emitting layer, the green light emitting layer, and the second blue light emitting layer into red light, wherein a proportion of light converted by the first light conversion layer is different from the second light conversion layer, and
   wherein the first light conversion layer includes a plurality of first light conversion layer patterns spaced apart from each other.

2. The display device of claim 1, wherein a thickness of the first light conversion layer is smaller than a thickness of the second light conversion layer.

3. The display device of claim 1, wherein each of the first light conversion layer and the second light conversion layer includes:
   a base member; and
   a light conversion material distributed in the base member,
   wherein a concentration of the light conversion material in the first light conversion layer is lower than a concentration of the light conversion material in the second light conversion layer.

4. The display device of claim 1, wherein the first light conversion layer has higher efficiency of converting green light into red light than an efficiency of converting blue light into red light.

5. The display device of claim 1, wherein the second light conversion layer has higher efficiency of converting blue light into red light than the first light conversion layer.

6. The display device of claim 1, wherein the second light conversion layer is disposed more adjacent to the light emitting element than the red color filter.

7. The display device of claim 6, wherein, on a cross section, a width of the second light conversion layer is smaller than or equal to a width of the red color filter.

8. A display device comprising:
   a light emitting unit disposed in a plurality of subpixels including a plurality of white subpixels and a plurality of red subpixels and including a light emitting layer emitting blue light and a light emitting layer emitting green light;
   a first light conversion layer disposed in the plurality of white subpixels to convert the light emitted from the light emitting unit into red light;
   a second light conversion layer disposed in the plurality of red subpixels to convert the light emitted from the light emitting unit into red light; and
   a red color filter disposed below the second light conversion layer in each of the plurality of red subpixels,
   wherein a light conversion efficiency of the second light conversion layer is higher than a light conversion efficiency of the first light conversion layer and wherein the first light conversion layer and the second light conversion layer convert different proportions of light emitted from the light emitting layer, and wherein the first light conversion layer includes a plurality of first light conversion layer patterns spaced apart from each other.

9. The display device of claim 8, wherein each of the first light conversion layer and the second light conversion layer includes a light conversion material coated on a base member.

10. The display device of claim 9, wherein a thickness of the first light conversion layer is smaller than a thickness of the second light conversion layer, and a concentration of the light conversion material in the first light conversion layer is equal to a concentration of the light conversion material in the second light conversion layer.

11. The display device of claim 9, wherein a thickness of the first light conversion layer is equal to a thickness of the second light conversion layer, and a concentration of the light conversion material in the first light conversion layer is lower than a concentration of the light conversion material in the second light conversion layer.

12. The display device of claim 9, wherein the light conversion material includes:

a first light conversion material disposed in the first light conversion layer; and a second light conversion material disposed in the second light conversion layer and having a different material or size from the first light conversion material, and wherein the first light conversion material has a higher efficiency of converting green light into red light than an efficiency of converting blue light into red light.

13. The display device of claim 12, wherein the second light conversion material has a higher efficiency of converting blue light into red light than the first light conversion material.

14. The display device of claim 8, wherein on a plane, a size of the red color filter is larger than or equal to a size of the second light conversion layer.

* * * * *